(12) United States Patent
Jankowski (10) Patent No.: US 11,940,474 B2
(45) Date of Patent: Mar. 26, 2024

(54) MEASURING DEVICE (71) Applicant: Phoenix Contact GmbH & Co. KG, Blomberg (DE)

(72) Inventor: Martin Jankowski, Seelze (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 431 days.

(21) Appl. No.: 17/286,809

(22) PCT Filed: Oct. 11, 2019

(86) PCT No.: PCT/EP2019/077570
§ 371 (c)(1),
(2) Date: Apr. 19, 2021

(87) PCT Pub. No.: WO2020/083664
PCT Pub. Date: Apr. 30, 2020

(65) Prior Publication Data
US 2021/0356500 A1 Nov. 18, 2021

(30) Foreign Application Priority Data
Oct. 26, 2018 (BE) .................................. 2018/5742

(51) Int. Cl.
*G01R 19/25* (2006.01)
*G01R 1/20* (2006.01)
*G01R 19/252* (2006.01)

(52) U.S. Cl.
CPC .......... *G01R 19/252* (2013.01); *G01R 1/206* (2013.01); *G01R 19/2516* (2013.01)

(58) Field of Classification Search
CPC ...... G01R 15/12; G01R 15/144; G01R 19/00; G01R 19/30; G01R 21/06; G01R 31/261; G01R 31/2623
See application file for complete search history.

(56) References Cited

U.S. PATENT DOCUMENTS 8,378,672 B2 * 2/2013 Bidenbach ......... G01R 31/2884
324/225
2014/0159756 A1 6/2014 Ueno et al.
(Continued)

FOREIGN PATENT DOCUMENTS

CN 202041578 U 11/2011
CN 202939299 U 5/2013
(Continued)

*Primary Examiner* — Tung X Nguyen
(74) *Attorney, Agent, or Firm* — Holland & Hart LLP (57) ABSTRACT

The disclosure relates to a measuring device for measuring a physical variable. The measuring device has a converter, which is designed to convert an input variable present at a measurement input, into a measurement signal and to provide the same as an output variable. The measuring device comprises a processing unit, which is configured to process the output variable of the converter, and a signal generator, which is designed to generate a test signal on the basis of a specification which test signal corresponds to an output variable of the converter to an input variable of the converter corresponding to the specification. The processing unit can be connected via a switching element either to an output of the converter or to an output of the signal generator. The disclosure further relates to a method for testing a measuring device.

21 Claims, 3 Drawing Sheets

(56) References Cited

U.S. PATENT DOCUMENTS

2017/0045570 A1    2/2017  Oda
2017/0209065 A1*   7/2017  Langley, II ............ A61B 5/725

FOREIGN PATENT DOCUMENTS

| CN | 103278791 A | 9/2013 |
|----|----|----|
| CN | 103328994 A | 9/2013 |
| CN | 103703382 A | 4/2014 |
| CN | 104729539 A | 6/2015 |
| CN | 104823069 A | 8/2015 |
| CN | 104981708 A | 10/2015 |
| CN | 105785183 A | 7/2016 |
| CN | 105842510 A | 8/2016 |
| DE | 10 2014 111 758 A1 | 2/2016 |
| DE | 102007012214 A1 | 9/2018 |
| EP | 1970720 A2 | 9/2008 |
| EP | 2557703 A1 | 2/2013 |
| JP | H1169598 A | 3/1999 |
| JP | 2013042280 A | 2/2013 |
| WO | WO 9817003 A2 | 4/1998 |
| WO | WO 2013038176 A2 | 3/2013 |

\* cited by examiner

MEASURING DEVICE

CROSS-REFERENCE TO RELATED APPLICATIONS

The present application is the national phase entry under 35 U.S.C. 371 of International Patent Application No. PCT/EP2019/077570 by Jankowski et al., entitled "MEASURING DEVICE," filed Oct. 11, 2019, and claims the benefit of Belgian Patent Application No. BE2018/5742 by Jankowski et al., entitled "MESSGERAT," filed Oct. 26, 2018, each of which is assigned to the assignee hereof and is incorporated by reference in its entirety.

FIELD OF THE DISCLOSURE

The present disclosure relates to a measuring device for measuring a physical variable and a method for testing a measuring device.

BACKGROUND

Measuring devices can be used to measure physical variables. For example, measuring devices are used to measure electrical power in one system, for example a multi-phase line system.

Such a measuring device can output error messages if the measured physical variable meets a predetermined condition. For example, the measuring device may indicate when the voltage or current of an electrical signal drops greatly or when a frequency of an electrical signal varies in an unusual manner.

To test such a measuring device, a source may be used which provides the corresponding physical variable. For example, a source for electrical power is used, which provides an electrical current and an electrical voltage to test a measuring device that can measure an electrical current or an electrical voltage.

However, it can be laborious and expensive to provide such a corresponding physical variable. For example for a charging station in the e-mobility sector of vehicles, currents in the range of 500 A are possible, and these currents may be measured with a measuring device, and if said currents are tested by a measuring device, a power source may be used, which provides 500 A.

SUMMARY

An improved concept for testing a measuring device is described herein.

The improved concept is achieved by the subject matter of the independent claims. Advantageous examples of the disclosure are the subject matter of the dependent claims, the description, and the accompanying figures.

The disclosure is based on the knowledge that a signal synthesizer in the measuring device imitates the output of an analog-to-digital converter to simulate a measurement input to the processing unit.

According to a first aspect, the object is achieved by a measuring device for measuring a physical variable. The measuring device has a converter, which is designed to convert an input variable present at a measurement input into a measurement signal and to provide the same as an output variable. The measuring device comprises a processing unit, which is configured to process the output variable of the converter. The measuring device comprises a signal generator which is designed to generate a test signal on the basis of a specification, which is designed to generate a test signal on the basis of a specification which test signal corresponds to an output variable of the converter to an input variable of the converter corresponding to the specification; wherein the processing unit can be connected via a switching element either with the converter or with to the signal generator.

The converter can be an analog-to-digital converter. The measurement input can be a socket or a plug to which measuring sensors can be connected. An input signal can be acquired via the measurement input to measure the physical variable. The input signal that is detected at the measurement input can be the input variable of the converter. The converter converts the input variable into an output variable. The output variable here is the measurement signal, i.e. the signal that the converter forwards to the processing unit. The measurement signal can be a digital signal. The converter can comprise preprocessing, such as reducing a current intensity. The preprocessing is upstream of the converter. The preprocessing can comprise a sensor or a current transformer. The physical variable can also be fed directly into the converter. A signal in analog form is present at the input of the converter. This signal has properties that characterize the signal.

Testing can comprise a demonstration or training. For example, in addition to the functional test of the measuring device, the test mode can be demonstrated to a customer for a demonstration or used to train personnel. This can prepare the user more precisely for handling the measuring device and thus increase safety, as there are fewer operating errors.

The processing unit can comprise integrated electronics. The processing unit can comprise logical building blocks. The processing unit is designed to process the measurement signal provided by the converter. For example, the processing unit generates a display signal, which can be displayed on a display from the output variable of the converter, i.e. from the measurement signal. The processing unit can evaluate the measurement signal, i.e. determine whether limit values are adhered to, unusual conditions occur or other errors occur.

The converter generates a digital signal, the information content of which describes the properties of the input signal of the converter. The signal generator generates a digital signal, the information content of which describes the properties according to the specification. If the values of the specification represent the same signal that is present at the input of the converter, then the output signals of the converter and the signal generator would be identical if both would provide an output signal at the same time.

The signal generator can be a synthesizer. The signal generator can be designed to generate a digital electrical signal. The signal generation can be dependent on a specification. The specification can comprise one or more parameters that are necessary for determining and generating a test signal. The specification can be read out completely or partially from a memory which is arranged in the measuring device. The specification from an external source, for example a computer system, can only be a modification of individual specified parameters of the signal that is to be generated. The specification can only adapt one of the several parameters that are necessary to generate a test signal. The specification can come entirely from an external source. The memory can be dispensed in this case. The specification can represent the properties of the signal at the input of the converter. This means that the specification provides values that represent the analog input signal applied to the converter. The specification comprises the parameters that represent the signal that the converter receives at the input of the converter.

The switching element can be designed in software or physically. For example, the signal generator and the processing unit can be part of a microcontroller. The switchover can take place within the microcontroller, in particular software-based. A signal input of the processing unit can be switched over in this case.

The test signal that the signal generator generates corresponds to an output variable of the converter. In other words, if the converter would record an input variable present at the measurement input, it would convert this input variable into a measurement signal and provide it as an output variable, consequently the test signal of the signal generator of precisely corresponds to this output variable, if the specification that is provided to the signal generator precisely describes the signal that is present at the measurement input as the input variable of the converter.

If, for example, a household socket common in Germany is measured by the measuring device, a voltage of 230 V and/or a current value of 16 A can be applied to the measurement input as an input variable. This is an alternating voltage with 50 Hz. The converter converts these measurement values into one measurement signal or several measurement signals and provides this measurement signal or these measurement signals as an output variable. The measuring device can, for example, determine a display from the output variable and can thus show a voltage value of 230 V and a current value of 16 Å on a display. The measuring device can also carry out further processing steps and, if necessary, output results and warnings.

If the measuring device is operated in test mode, a voltage value of 230 V, a current value of 16 A and a frequency of 50 Hz can be specified for the signal generator. The signal generator then generates an artificial measurement signal as a test signal and in this way simulates an output signal from the converter. The test signal corresponds exactly to the signal that the converter has provided to the processing unit. In particular, the test signal is provided directly to the processing unit. That is to say, when the signal generator is connected to an input of the processing unit, the processing unit receives the same signal, that is to say a signal with the same signal properties, as the signal that was previously output by the converter. The display which the processing unit provides, that is to say the output of the processing unit, in this case corresponds exactly to the output of the processing unit, as if the converter is connected to the processing unit. If the output of the processing unit is output on a display, this also shows 230 V and 16 A.

The specification can comprise a voltage in percent or volts. The specification can comprise a current in percent or amperes. The specification can comprise a phase angle, a frequency for all lines or harmonics for voltages and currents. The specification can comprise a dynamic change. The corresponding value can be varied within specified limits according to the random principle.

It is advantageous here that no precise and expensive current or voltage source has to be provided that can provide the corresponding signals. It is sufficient to feed the specifications into the measuring device that are to be tested as signals. The signal generator then generates a test signal internally in the measuring device that corresponds to the output variable of the converter. The device functions of the measuring device can be retained. These can comprise a web server, Modbus interface, display, average values, log functions, limit value switches, error messages and other analog or digital interfaces. The complete process chain can be retained and the functions of the measuring device can be used as before.

According to one example, the measuring device is designed to measure an electrical variable. This enables a current or voltage to be measured.

According to one example, the measuring device has six measurement inputs and is designed to measure a voltage and a current of a three-phase line, respectively; or wherein the measuring device has two measurement inputs and is designed to measure a voltage and a current of a single-phase line, respectively, and wherein the signal generator is designed to generate two corresponding test signals. Here, the signal generator is designed to generate six corresponding test signals.

The measuring device can be a measuring device with which a multi-phase system can be measured. In particular, three lines of a multi-phase system can be measured. If the power is to be measured in each phase of the system, six measurement inputs may be used, a voltage input and a current input for each of the phases. Internally, the processing unit of the measuring device can then use the inputs assigned to a line to calculate the power from the voltage and the current. In this case, the signal generator also provides six outputs, each corresponding to a converter output. Likewise, further values can be measured, for example an energy, a distortion, in particular THD, or something else. The sockets for connecting measuring cables or measuring sensors can differ from the measurement inputs mentioned here. In particular, a measurement input for a current measurement can have two sockets. The measuring device can also have further sockets for each measurement input. For voltage values, a measurement input also comprises one reference point. A measurement input has two sockets for current measurement.

In one example, the measuring device can be connected to a computer system and is designed to receive the specification for the test signal from the computer system.

The computer system can be a PC, a laptop, or a smartphone.

The computer system can be connected to the measuring device via a wireless interface or a wired interface. The input of the specification can take place in a user-friendly manner via the computer system and use a known data transmission, which reduces the effort involved in entering the specification.

In one example, the specification comprises a phase and/or a frequency and/or a harmonic and/or an amplitude of a signal. Here the signal generator is designed to generate the test signal on the basis of at least one of these parameters. The frequency can apply to the entire system measured by the measuring device. The resulting effective values of the base waves for current and voltage are specified for each phase. In addition, the phase shift angle can be specified for each of the phases. If not only sinusoidal values are to be specified, the harmonics for each current and voltage and their angles can optionally be specified. One or more harmonics can be specified in each case.

The signal generator can generate a test signal. The test signal can have basic values that are stored, for example, in a memory of the measuring device. In this way, the signal generator can generate a test signal even if not all parameters are specified separately externally. Through the external input, i.e. the specification, it can be specified which parameters the test signal has to cover. Here, for example, a phase and/or a frequency and/or a harmonic and/or an amplitude of the test signal can be determined. If several specifications for a test signal or several test signals are entered, for example to simulate a three-phase line, the individual test signals can for example be generated out of phase in order to satisfy a corresponding measured value. A harmonic of a signal can also be simulated.

In one example, the switching element comprises an electronic switch. Here, the measuring device is designed to switch the switching element as a function of a control signal. An electronic switch can be implemented in software. There is no need for a physical switch. A signal input can be switched in a logic via the switching element. For example in a microcontroller.

A computer system can be connected to the measuring device. The computer system can be used to switch the measuring device from a measuring mode to a test mode and the input of the processing unit instead of the output of the converter can be connected to the output of the signal generator. This provides a safe switchover in which an accidental switchover of a switch is not possible.

In one example, the measuring device is designed to query a security feature in order to switch the switching element, in particular a password and/or an electronic identifier.

In order to prevent incorrect switching of the measuring device from the measuring mode to the test mode, the switching of the switching element can be protected. A password, for example an alphanumeric character string and/or an electronic identifier, for example a token or an electronic ID, can be requested.

In one example, the measuring device is designed to communicate via a Modbus-interface and to receive the specification via the Modbus. A Modbus is an interface that can be used to communicate with programmable logic controllers. The measuring device can be easily connected in this case.

In one example, the measuring device comprises an output interface, in particular a display. Here, the processing unit is designed to output the processed output variable via the output interface. This enables the measured values to be read off easily if the output is via the display. If the measuring device is in test mode, the processed test signal can be displayed. The display can comprise a visual display or another interface.

In one example, the switching element is integrated in a microcontroller. This has the advantage that the switching element can be implemented inexpensively.

According to a second aspect of the disclosure, the object is achieved by a method for testing a measuring device. The method comprises:

Switching a switching element in order to connect a processing unit of the measuring device to a signal generator of the measuring device, wherein the signal generator is designed to generate a test signal on the basis of the specification;

Receiving the specification for the test signal at a control input of the measuring device;

Outputting the test signal by the signal generator based on the specification to the processing unit; and Processing of the output test signal by the processing unit.

In one example, the method comprises outputting the processed test signal on a display.

In one example, the outputting of the test signal comprises outputting an indication that the output is based on a test signal.

This can increase the level of security and prevent accidental operation of the measuring device in test mode.

In one example, a security query is carried out before the step of switching the switching element. The switching element is only switched to the signal generator if a result of the security query is positive.

The security query can comprise the input of a password, in particular an alphanumeric character string, the recording of a biometric input or an electronic identifier, such as from a token or an electronic ID. Only if this security query determines that the security criterion has been met, i.e. if it is determined that the user is authorized to switch the measuring device to the test mode, the measuring device is switched to the test mode.

In one example, a display for displaying the switching position of the switching element is output when the switching element connects the signal generator to the processing unit.

This allows the switching of the measuring device to the test mode to be displayed, regardless of whether a test signal is being generated or not.

In one example, the method further comprises:

Switching the switching element from the signal generator to the converter if the switching element was previously switched in such a way that the signal generator was connected to the processing unit and a predetermined period of time has elapsed. This ensures that it is not forgotten to switch the measuring device back to measuring mode.

The measuring device can be switched back to measuring mode. Switching back can also take place during or by resetting or restarting the measuring device.

For this purpose, the measuring device can have a timer.

In one example, the specification comprises a change in a parameter in order to represent a faulty signal. The specification can be determined in such a way that it represents a signal that exhibits incorrect behavior. In this way, an error in a signal that would be measured by the measuring device can be simulated. The reaction of the measuring device to signal errors can also be determined. In one example, the specification is provided incorrectly. This can also be used to test the measuring device.

BRIEF DESCRIPTION OF THE DRAWINGS

The disclosure is described herein with respect to examples and the figures.

DETAILED DESCRIPTION

Figure 1:
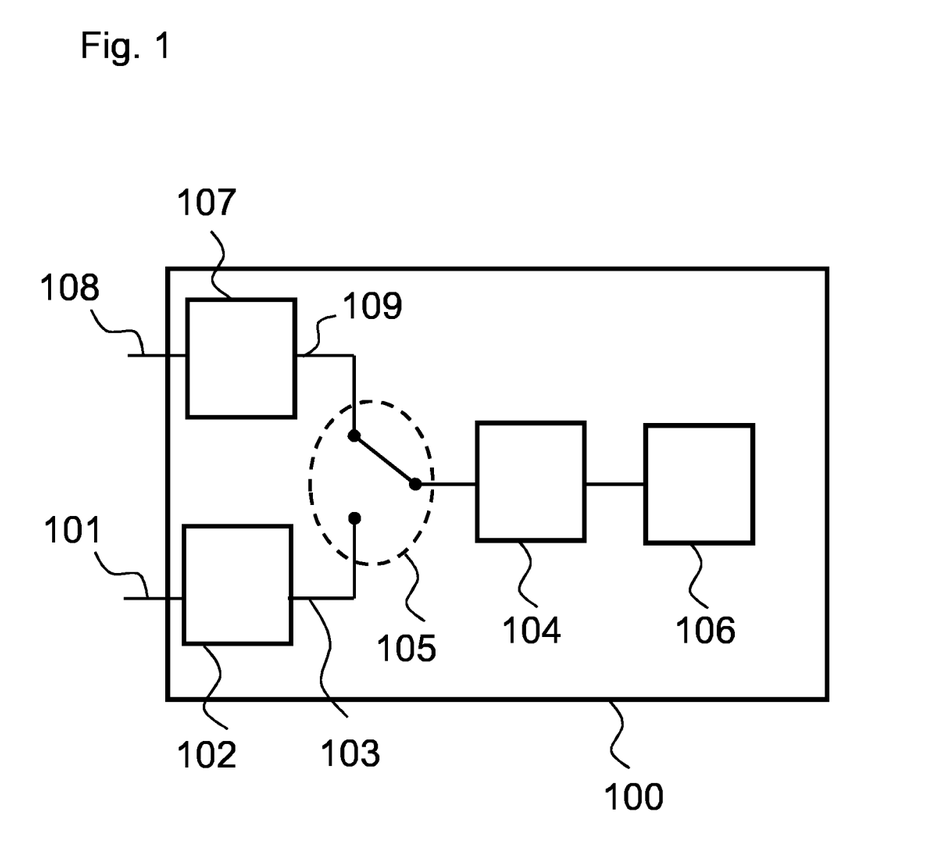
FIG. 1 shows a schematic representation of a measuring device according to an example.

FIG. 1 shows a measuring device 100. The measuring device 100 has a measurement input 101. In the example described, the measurement input 101 comprises six connections. In a further example, the measurement input 101 comprises one or a different number of connections. Three lines, each with current and voltage, can be connected via the six connections of the measurement input 101. In this way, a three-phase power line can be measured by the measuring device 100, so that the measuring device 100 can display the power of each phase of a three-phase line. A connector can comprise a plurality of sockets. In particular, a power connection, via which a current measurement is possible, can comprise two sockets.

The measuring device 100 is a measuring device for measuring an electrical power and other values that can be derived from the measured data, such as, for example, electrical energy. Physical values can also be displayed directly, for example a voltage. In a further example, the measuring device 100 is another measuring device, for example for measuring an electrical voltage, a temperature or a spatial distance or a further physical variable.

The measuring device 100 comprises a converter 102. The converter 102 is an analog/digital converter. The converter 102 converts an input variable that is present at the measurement input 101 into a digital output variable. The converter 102 thus provides an output variable at an output 103 of the converter. The output variable is a measurement signal that reflects the measured physical variable. In addition to the analog/digital converter, the converter 102 also comprises preprocessing (not shown) in order to process the measured signals before they are fed into the converter 102, in particular to perform conditioning or transformation of the signal. The converter 102 with the preprocessing can represent an analog front end.

The measurement signal, that is to say the output variable of the converter 102 at the output 103 of the converter, can be processed by a processing unit 104 of the measuring device 100. For this purpose, the processing unit 104 can be electrically connected to the output 103 of the converter 102. For this purpose, a switching element 105 is arranged between the processing unit 104 and the output 103 of the converter 102. If the switching element 105 is in a first switching position, the output 103 of the converter 102 is connected to an input of the processing unit 104. The output variable, i.e. the measurement signal, of the converter 102 is thus present at the input of the processing unit 104. The processing unit 104 interprets the measurement signal and, if necessary, uses it to calculate further value parameters that are to be recorded by the measuring device 100. The processing unit 104 can derive further physical variables from the measurement signal or compare the physical variable represented by the measurement signal with limit values and, if necessary, generate an error message or a warning.

The measuring device 100 has an output interface 106. The output interface 106 is used to output the measured values of the measuring device 100; in particular, the output interface 106 comprises a display in order to present the measured physical variable to a user. For example, an electrical voltage can be represented in volts and an electrical current in amperes. Corresponding other physical values can be represented in further examples. The processing unit 104 is designed to transmit the processed measurement signal to the output interface 106 and thus to display the value measured by the measurement signal in the measurement mode on the output interface 106.

The measuring device 100 comprises a signal generator 107. The signal generator 107 is connected to a control input 108. The control input 108 can meet a communication standard, for example it can be designed as a Modbus-interface. A specification can be made to the signal generator 107 via the control input 108. The specification can comprise values of a physical variable. For example, a voltage value can be set to 230 V, in particular an effective value of a voltage signal can be set to 230 V, and a current intensity, i.e. an effective value of a current intensity can be set to 16 A. A frequency of a signal can also be set to 50 Hz; other values are also possible. One or more harmonics or a phase shift can also be specified. The harmonic can relate to a current or a voltage.

The signal generator 107 is designed to output a test signal at an output 109 of the signal generator 107. The test signal simulates the measurement signal of the converter 102. The test signal represents a synthetic measurement signal. The operation of the measuring device 100 can be simulated with the aid of the signal generator 107 and the test signal. For example, for demonstration or test purposes, it can be checked whether the measuring device 100 reacts to certain signal changes or signals.

In a switching position, not shown, the switching element 105 is in a first switching position and thus connects the converter 102 to the processing unit 104. This position is the measuring mode of the measuring device 100. A physical variable can be measured via the measurement input 101. For example, a first voltage of 231.2 V, a second voltage of 230.9 V and a third voltage of 229.8 V are measured via the measurement input 101. Corresponding currents can also be measured via further connections of the measurement input 101. The converter 102 converts these measured analog voltage values into digital signals. The digital signals are present as an output variable or as a measurement signal at the output 103 of the converter 102. Since the measuring device 100 is in the measuring mode, these signals are also applied to the processing unit 104. The processing unit 104 can select from the values, i.e. from the voltage and current, to calculate the respective power of one phase of a three-phase line, but also other values. These processed values can be output, in particular displayed, via the output interface 106.

If it is now to be tested whether the measuring device 100 can, for example, detect a voltage drop on one of the lines, it is not necessary to provide a line with a voltage and then to bring about a voltage drop on this line.

Thanks to the test mode of the measuring device 100, the measuring device 100 can be switched in the test mode via the switching element 105 by switching the switching element 105 from the first switching state to a second switching state. In the test mode, the converter 102 is not connected to the processing unit 104. Instead, the signal generator 107 is connected to the input of the processing unit 104 via the output 109 of the signal generator 107.

Via the control input 108, a specification can be made for the signal generator 107 to generate a test signal that the converter 102 would have generated if an input variable would be present at the measurement input 101 that is mapped by the specification. For example, it can be specified that a voltage signal is 231.2 V and that it experiences a voltage drop of 95% after approx. 10 s. The other values correspond to, for example, values for a three-phase power line. These can be specified via the control input 108 or are provided by the signal generator 107 from an internal memory (not shown). The signal generator 107 now generates a test signal and works as a synthesizer. The signal generator 107 generates the test signal in such a way that there is no difference for the processing unit 104 between a measured signal, which the converter 102 converts into a measurement signal, and the test signal of the signal generator 107. The processing unit 104 interprets the test signal as an output variable of the converter 102. The processing unit 104 processes the test signal in the same way as the output of the converter 102, i.e. the measurement signal. The processing unit 104 outputs the test signal, i.e. the supposedly measured value of the physical variable via the output interface 106. It can now be read that the voltage drop is displayed correctly or not, in the event that an error has occurred in the processing unit 104.

The test signal can be used to check the functionality of the measuring device 100. Furthermore, the test signal can be used for training purposes or demonstration purposes in order to instruct users in the use of the measuring device 100.

Figure 2:
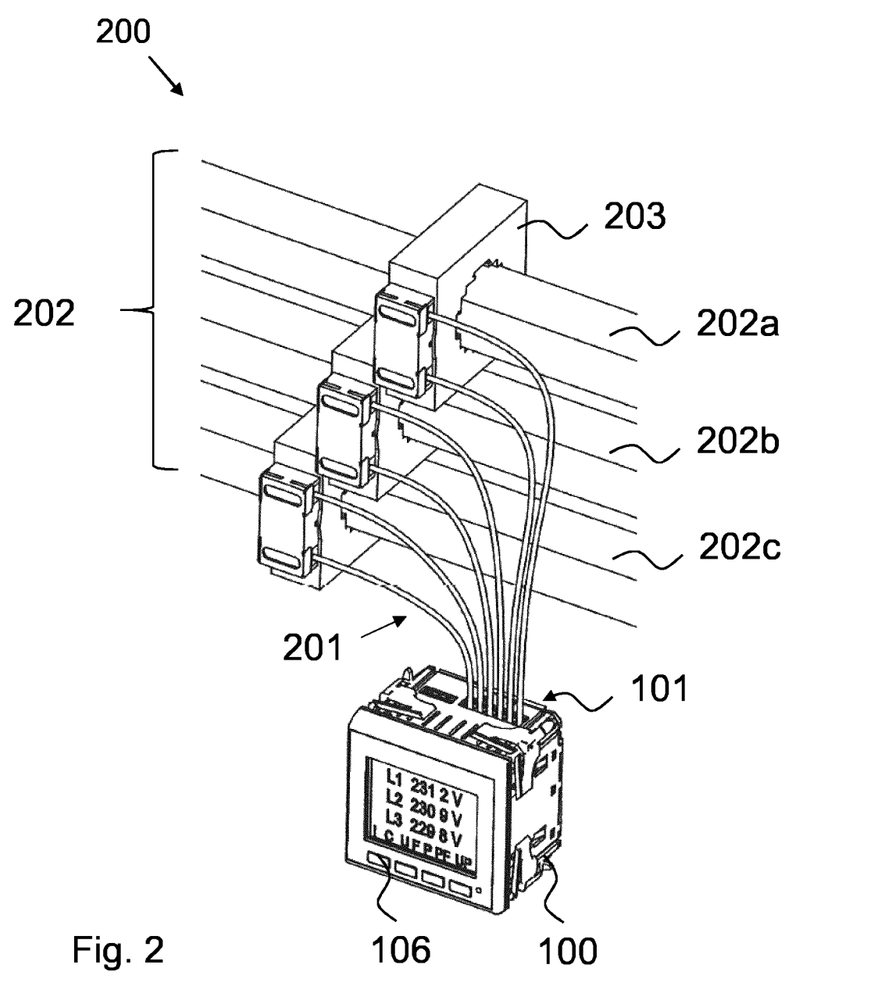
FIG. 2 shows a schematic representation of an arrangement of a measuring device according to an example.

FIG. 2 shows an arrangement 200 with the measuring device 100. The output interface 106 can be seen at the measuring device 100. Six measuring lines 201, i.e. measuring sensors, which are connected to the measurement input 101 of the measuring device 100, lead into the measuring device 100. The measuring lines 201 are connected to a first phase 202a, a second phase 202b and a third phase 202c of a three-phase electrical line 202. In each case two connections of the measurement input 101 are connected to one of the phases 202a, 202b, 202c of the electrical line 202, via a current transducer 203. In each case two measurement lines 201 of a phase 202a, 202b, 202c are designed for measuring a current. In further examples, further measuring lines 201 are used in order to additionally or alternatively detect further parameters, such as, for example, a voltage.

Figure 3:
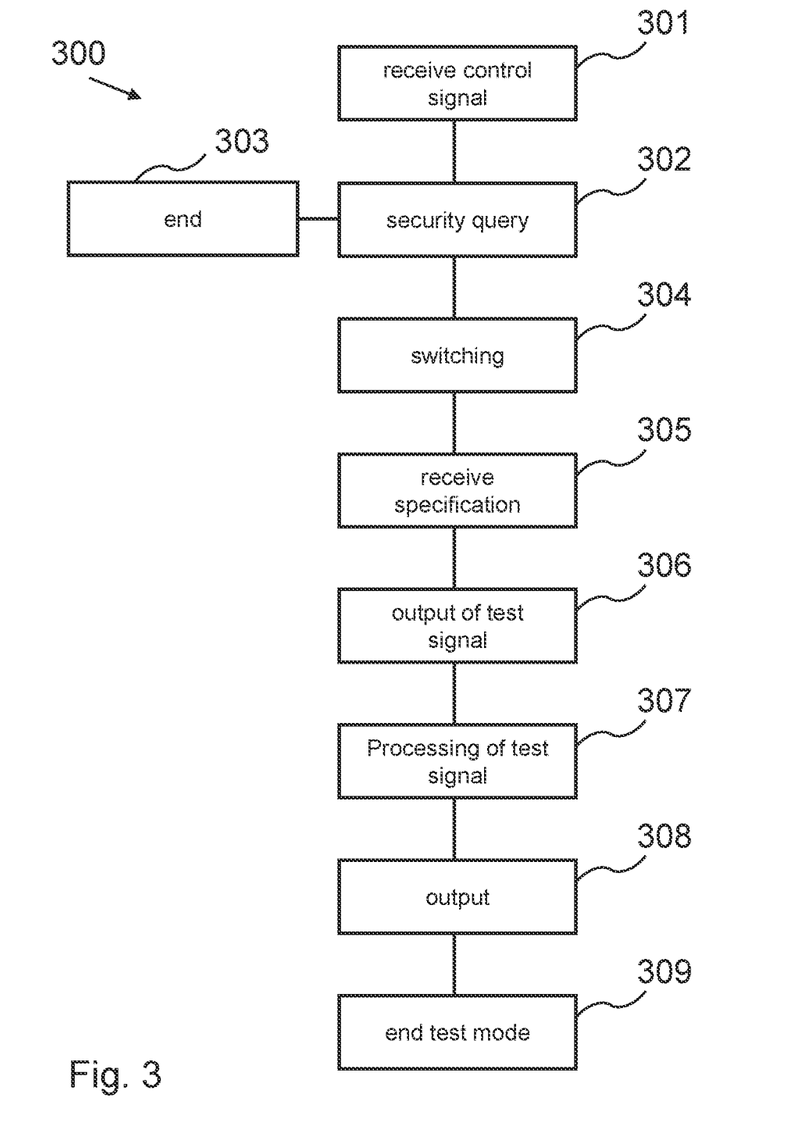
FIG. 3 shows a flow diagram for a method according to an example.

FIG. 3 shows a flow diagram 300 for a method for testing a measuring device 100 according to an example.

In step 301, the measuring device 100 receives a control signal at the control input 108. The control signal indicates that the switching element 105 is to be switched from the first switching position to the second switching position and the measuring device 100 is thus to switch from measuring mode to test mode. An administrator mode can be adopted here. This can comprise a soft reset. The test mode can also be run outside of the administrator mode. However, an administrator mode may be used to switch. In a further example, no administrator mode is necessary.

The measuring device 100 then initiates a security query in step 302. Here, a user is requested to enter a password via the control input 108. In a further exemplary example, the security query comprises the acquisition of a biometric reference, an electronic identifier, or the like. If the security question is negative, i.e. if, for example, the password was entered incorrectly or no password was entered, the user who sent the control signal 108 to switch to the test mode is not authenticated and the method ends in step 303. The switchover from the first switch position to the second switch position of the Switching element 105 is not performed by measuring device 10.

If the result of the security query in step 302 is positive, i.e. If the user was correctly authenticated, then in step 304 the switching element 105 is switched from the first switching state to the second switching state. In this case, the switching element 105, here an internal switchover of a signal input of a microcontroller, is switched over electronically. In a further example, this can involve other switching elements, such as a bipolar transistor. In another example, a mechanical switching path is released.

With the switching of the switching element 105 into the test mode, i.e. the second switching state of the switching element 105, a timer begins to run at the same time. The timer measures the time, i.e. the duration for which the switching element 105 is in the second switching state. Independently of further input signals, the switching element 105 switches back to the first switching state after the timer has expired or after a predetermined time has been reached. This can serve as a security so that it is not forgotten to switch the measuring device 100 back to the measuring mode. In a further example, this automatic shifting back does not take place. A timer can be omitted in this case.

In step 305 a specification is received. The specification is provided to the signal generator 107 via the control input 108. The specification here comprises parameters that influence and/or determine an electrical signal. Further necessary parameters for generating such a signal are either preset as standard by a memory or may be entered by the user via the control input 108. The properties of an electrical signal can be determined by the specification. In particular, the specification comprises an amplitude and/or frequency and/or phase and/or harmonic.

The signal generator 107 can output the test signal in step 306 on the basis of the specification received. The test signal is output by the signal generator 107 via the output 109 of the signal generator 107. Since the switching element 105 is in a second switching state, the output 109 of the signal generator 107 is connected to the input of the processing unit 104. The test signal is therefore now applied to the processing unit 104 instead of a measurement signal. The processing unit 104, however, interprets the test signal as a measurement signal and processes it as if it would come from the converter 102 and would represent an actually measured physical variable.

The processing of the processing unit 104 takes place in step 307. The processing unit 104 interprets the test signal in accordance with certain specifications, for example a power or another value is calculated from this.

In step 308, the processing unit 104 provides the output interface 106 with an output in order to display or otherwise output the values of the test signal on the display. In this way, the user can check whether the display corresponds to the expectations according to the input specifications. In a further exemplary example, no output is issued if there is no error or some other predetermined event.

In step 309, the measuring device 100 detects that the control input 108 no longer delivers a signal. This means that, for example, a plug has been pulled from the control input 108. The switching element 105 then switches back to the first switching state and sets the measuring device 100 back to the measuring state.

In a further example, this does not take place automatically. Here, a user has to switch back the measuring device 100 manually. To this end, for example, the user may again apply a control signal via the control input 108 in order to switch the switching element 105 back. In this case, the measuring device 100 is actively switched back, for example via a reset or a restart.

The output interface 106 can also be used to indicate that the measuring device 100 is in the test mode. This display can be dependent on the switching position of the switching element 105. It can also be indicated that the display is based on a test signal.

LIST OF REFERENCE NUMBERS

100 measuring device
101 intensity input
102 converter
103 output
104 processing unit
105 switching element
106 output interface
107 signal generator
108 control input
109 output
200 arrangement
201 test line
202 three-phase line
202a, 202b, 2102c phase
203 current transducers
300 flow chart
301-309 method step

What is claimed is:

1. A measuring device for measuring a physical variable with:
   a converter configured to convert an input variable present at a measurement input into a measurement signal and to provide the same as an output variable;
   a processing unit configured to process the output variable of the converter; and
   a signal generator, configured to generate a test signal on a basis of a specification, wherein the test signal corresponds to an output variable of the converter and an input variable of the converter corresponding to the specification;
   wherein the processing unit is configured to be connected, via a switching element, either to the converter or to the signal generator.

2. The measuring device of claim 1, wherein the measuring device is configured to measure an electrical variable.

3. The measuring device of claim 2, wherein the measuring device has six measurement inputs and is configured to measure a voltage and a current of a three-phase line, respectively, and wherein the signal generator is configured to generate six corresponding test signals.

4. The measuring device of claim 1, wherein the measuring device is configured to be connected to a computer system and is configured to receive the specification for the test signal from the computer system.

5. The measuring device of claim 1, wherein the specification comprises a phase shift, a frequency, a harmonic, an effective value, or a combination thereof, and wherein the signal generator is configured to generate the test signal on the basis of at least one of these parameters.

6. The measuring device of claim 1, wherein the switching element comprises an electronic switch and the measuring device is configured to switch the switching element as a function of a control signal.

7. The measuring device of claim 6, wherein the measuring device is configured to query a security feature comprising a password, an electronic identifier, or a combination thereof, to switch the switching element.

8. The measuring device of claim 1, wherein the measuring device is configured to communicate via a Modbus-interface and to receive the specification via the Modbus-interface.

9. The measuring device of claim 1, wherein the measuring device comprises:
   an output interface and the processing unit is configured to output the processed output variable via the output interface.

10. The measuring device of claim 1, wherein the switching element comprises an electronic switch in a microcontroller or a transistor.

11. A method for testing a measuring device for measuring a physical variable, the measuring device comprising a converter configured to convert an input variable present at a measurement input into a measurement signal and to provide the same as an output variable, the method comprising:
    switching a switching element to connect a processing unit of the measuring device to a signal generator of the measuring device, wherein the signal generator is configured to generate a test signal on a basis of a specification, and wherein the test signal corresponds to an output variable of the converter and an input variable of the converter corresponding to the specification;
    receiving the specification for the test signal at a control input of the measuring device;
    outputting the test signal by the signal generator based on the specification to the processing unit; and
    processing the output test signal by the processing unit.

12. The method of claim 11, further comprising:
    outputting the processed test signal via an output interface of the measuring device.

13. The method of claim 11, wherein outputting the test signal comprises outputting an indication that the output is based on a test signal.

14. The method of claim 11, wherein a security query is performed before switching the switching element, and wherein the switching element is switched to the signal generator based at least in part on a result of the security query being positive.

15. The method of claim 11, wherein a display for displaying a switching position of the switching element is output when the switching element connects the signal generator to the processing unit.

16. The method of claim 11, wherein the specification comprises a change in a parameter to represent an erroneous signal.

17. The measuring device of claim 1, wherein the measuring device has two measurement inputs and is configured to measure a voltage and a current of a single-phase line, respectively, and wherein the signal generator is configured to generate two corresponding test signals.

18. The measuring device of claim 10, wherein the transistor comprises a metal-oxide-semiconductor field-effect transistor (MOSFET) or a bipolar transistor.

19. The method of claim 11, wherein receiving the specification comprises receiving the specification via a Modbus-interface.

20. The method of claim 16, wherein the parameter comprises a phase shift, a frequency, a harmonic, an effective value, or a combination thereof.

21. A method for testing a measuring device comprising:
    switching a switching element to connect a processing unit of the measuring device to a signal generator of the measuring device, wherein the signal generator is configured to generate a test signal on a basis of a specification;
    receiving the specification for the test signal at a control input of the measuring device;
    outputting the test signal by the signal generator based on the specification to the processing unit; and
    processing the output test signal by the processing unit,
    wherein a security query is performed before switching the switching element, and wherein the switching element is switched to the signal generator based at least in part on a result of the security query being positive.

* * * * *